(12) United States Patent
Wu et al.

(10) Patent No.: US 11,837,510 B2
(45) Date of Patent: Dec. 5, 2023

(54) METHOD FOR ANALYZING SILICON SUBSTRATE

(71) Applicants: Kioxia Corporation, Tokyo (JP); IAS Inc., Tokyo (JP)

(72) Inventors: Jiahong Wu, Tokyo (JP); Katsuhiko Kawabata, Tokyo (JP); Mitsumasa Ikeuchi, Tokyo (JP); Sungjae Lee, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 677 days.

(21) Appl. No.: 17/043,964

(22) PCT Filed: Apr. 8, 2019

(86) PCT No.: PCT/JP2019/015243
§ 371 (c)(1),
(2) Date: Sep. 30, 2020

(87) PCT Pub. No.: WO2019/198651
PCT Pub. Date: Oct. 17, 2019

(65) Prior Publication Data
US 2021/0118751 A1    Apr. 22, 2021

(30) Foreign Application Priority Data

Apr. 13, 2018   (JP) ................................. 2018-077292

(51) Int. Cl.
*H01L 21/66* (2006.01)
*C30B 29/06* (2006.01)
(Continued)

(52) U.S. Cl.
CPC ............. *H01L 22/10* (2013.01); *C30B 29/06* (2013.01); *C30B 33/08* (2013.01); *G01N 27/62* (2013.01);
(Continued)

(58) Field of Classification Search
CPC .......... H01L 21/0262; H01L 21/32134; H01L 22/10; C30B 29/06; C30B 33/08; G01N 27/62
See application file for complete search history.

(56) References Cited

U.S. PATENT DOCUMENTS

| | | |
|---|---|---|
| 2003/0008404 A1 | 1/2003 | Tomita et al. |
| 2004/0206903 A1* | 10/2004 | Ushiki ...................... G21K 7/00 250/306 |

(Continued)

FOREIGN PATENT DOCUMENTS

| | | |
|---|---|---|
| JP | H10-092888 A | 4/1998 |
| JP | 11-281542 A | 10/1999 |

(Continued)

OTHER PUBLICATIONS

European Search Report for Application 19786161.0.

*Primary Examiner* — Mohsen Ahmadi
(74) *Attorney, Agent, or Firm* — Roberts & Roberts, LLP

(57) ABSTRACT

The present invention provides a method for analyzing a silicon substrate, by which impurities such as a very small amount of metal in a silicon substrate provided with a thick nitride film can be analyzed with high accuracy with ICP-MS, and is characterized by use of a silicon substrate analysis apparatus including an analysis scan port having a load port, a substrate conveyance robot, an aligner, a drying chamber, a vapor phase decomposition chamber, an analysis stage and a nozzle for analysis of a substrate; an analysis liquid collection unit; and an analyzer for performing inductive coupling plasma analysis.

12 Claims, 2 Drawing Sheets

(51) Int. Cl.
*C30B 33/08* (2006.01)
*G01N 27/62* (2021.01)
*G01N 1/32* (2006.01)
*G01N 27/623* (2021.01)
*H01L 21/02* (2006.01)
*H01L 21/3213* (2006.01)

(52) U.S. Cl.
CPC .... *H01L 21/0262* (2013.01); *H01L 21/32134* (2013.01)

(56) References Cited

U.S. PATENT DOCUMENTS

2010/0003770 A1* 1/2010 Shibata .................. H01L 22/12
378/45
2013/0244349 A1 9/2013 Yamada et al.
2018/0217036 A1 8/2018 Kawabata et al.

FOREIGN PATENT DOCUMENTS

| | | |
|---|---|---|
| JP | 2002-372525 A | 12/2002 |
| JP | 2013190403 A | 9/2013 |
| JP | 2013-257272 A | 12/2013 |
| JP | 2016-57230 A | 4/2016 |
| JP | 6108367 B1 | 4/2017 |

* cited by examiner

METHOD FOR ANALYZING SILICON SUBSTRATE

TECHNICAL FIELD

The present invention relates to a method for analyzing impurities such as a very small amount of metal which are contained in a silicon substrate to be used for production of semiconductors, etc. Particularly, the present invention relates to a method for analyzing a silicon substrate, which is suitable for analysis of a silicon substrate with a nitride film having a large thickness formed on a surface of the silicon substrate to be analyzed.

BACKGROUND ART

For silicon substrates such as silicon wafers to be used for production of semiconductors etc., an analysis apparatus capable of detecting impurities such as metal, which affect device properties, has been required as devices have become highly integrated. A method using an inductive coupling plasma mass spectrometer (ICP-MS) is known as one of analysis methods enabling detection even when the amount of impurities such as metal in a silicon substrate is extremely small. This analysis method includes etching a silicon substrate by a vapor phase decomposition method in order to extract impurities such as metal in the silicon substrate in a form introducible into ICP-MS, scanning a surface of the etched silicon substrate with an analysis liquid to transfer the impurities such as metal into the analysis liquid, and introducing the analysis liquid into ICP-MS to perform analysis (e.g. Patent Document 1). In addition, Patent Document 2 discloses a method in which by use of a nozzle for analysis of a substrate, impurities in a silicon substrate are introduced into an analysis liquid, and analyzed.

With respect to these analysis methods, techniques for analyzing a silicon substrate with a thick nitride film, a silicon oxide film and the like formed on the substrate have been proposed (e.g. Patent Document 3). The analysis method according to Patent Document 3 includes subjecting to vapor phase decomposition treatment a silicon substrate to be analyzed, scanning a surface of the silicon substrate with a high-concentration recovery liquid, which is a mixed liquid of hydrofluoric acid with a concentration of 10 mass % to 30 mass % and hydrogen peroxide water with a concentration of 1 mass % to 30 mass %, through a nozzle for analysis of a substrate, recovering the high-concentration recovery liquid, discharging the recovered high-concentration recovery liquid to the surface of the silicon substrate, then drying the silicon substrate, to which the high-concentration recovery liquid is discharged, by heating, then scanning the surface of the silicon substrate with an analysis liquid through the nozzle for analysis of a substrate, and performing inductive coupling plasma analysis on the analysis liquid into which the analysis target is transferred. This method ensures that even when a relatively thick nitride film is formed on a silicon substrate, impacts of an ammonium fluoride-based while salt of $Si(NH_4)_xF_y$ generated in vapor phase decomposition performed with a hydrogen fluoride etching gas are suppressed to enable high-accuracy analysis with ICP-MS. Further, the burden of maintenance for the analysis apparatus can be reduced. Even when a relatively thick oxide film is formed on a silicon substrate, impacts of $Si(OH)_4$ and $H_2SiF_6$ generated in vapor phase decomposition performed with a hydrogen fluoride etching gas are suppressed to enable high-accuracy analysis with ICP-MS.

RELATED ART DOCUMENT

Patent Documents

Patent Document 1: JP H11-281542A
Patent Document 2: JP 2013-257272 A
Patent Document 3: JP 6108367 B2

SUMMARY OF THE INVENTION

Problems to be Solved by the Invention

However, when a nitride film having a considerably large thickness of, for example, 200 nm or more is formed on a silicon substrate, it may be impossible to perform high-accuracy analysis even by the above-described analysis method. This is because a nitride film formed on a silicon wafer is not ideal $Si_3N_4$, and thus the white salt after vapor phase decomposition with hydrofluoric acid is not in the form of ideal $Si(NH_4)_2F_6$, but in the form of $Si(NH_4)_xF_y$. An ideal nitride film has a chemical form of $Si_3N_4$, and the compound generated in vapor phase decomposition performed with a hydrofluoric acid etching gas is $Si(NH_4)_2F_6$. Heating of the compound causes the following reaction, so that Si can be removed as a $SiF_4$ gas to reduce the amount of Si on the surface of the silicon substrate.

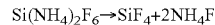

$$Si(NH_4)_2F_6 \rightarrow SiF_4 + 2NH_4F$$

However, the compound actually generated is $Si(NH_4)xFy$, and when a nitride film having a thickness of 200 nm or more is formed, the Si concentration in the analysis liquid is 1000 ppm or more even after heating in the presence of an excessive amount of hydrofluoric acid, so that it is impossible to perform high-accuracy analysis.

More specifically, according to the analysis method of Patent Document 3 as a prior art, a 12-inch silicon substrate on which a 100 nm-thick nitride film is formed is treated with a high-concentration recovery liquid, and dried to reduce the Si concentration in 1 mL of an analysis liquid to about 70 ppm, but when the nitride film has a thickness of 200 nm, Si remains in an amount of 1,000 ppm or more. The amount of Si removed varies depending on the amount of hydrofluoric acid in the high-concentration recovery liquid, and when the amount of hydrofluoric acid is small, a phenomenon occurs in which Si remains in an amount of 1,000 ppm to 10,000 ppm in 1 mL of the analysis liquid.

In view of the above-mentioned circumstances, an object of the present invention is to provide a method for analyzing a silicon substrate, by which impurities such as a very small amount of metal in a nitride film formed on a silicon substrate can be analyzed with high accuracy with ICP-MS even when the nitride film has a thickness of 200 nm or more.

Means for Solving the Problems

A first aspect of the present invention is a method for analyzing a silicon substrate by use of a silicon substrate analysis apparatus including: an analysis scan port having a load port for installing a storage cassette storing a silicon substrate to be analyzed, a substrate conveyance robot capable of drawing, conveying and installing the silicon substrate stored in the load port, an aligner for adjusting a position of the silicon substrate, a drying chamber for drying the silicon substrate by heating, a vapor phase decomposition chamber for etching the silicon substrate with an etching gas, an analysis stage on which the silicon substrate is placed, and a nozzle for analysis of a substrate for scanning with an analysis liquid a surface of the silicon substrate placed on the analysis stage, and recovering the analysis liquid into which an analysis target is transferred; an analysis liquid collection unit having an analysis container to be charged with the analysis liquid recovered through the nozzle for analysis of a substrate; a nebulizer for suctioning the analysis liquid put in the analysis container; and an analyzer for performing inductive coupling plasma analysis on the analysis liquid supplied from the nebulizer, the substrate having a nitride film formed thereon, the method including the steps of: conveying the silicon substrate drawn from the load port by the substrate conveyance robot to the vapor phase decomposition chamber, installing the silicon substrate in the vapor phase decomposition chamber, and subjecting the silicon substrate to vapor phase decomposition treatment with an etching gas in the vapor phase decomposition chamber; conveying the silicon substrate subjected to vapor phase decomposition treatment to the analysis stage of the analysis scan port, placing the silicon substrate on the analysis stage, scanning the surface of the silicon substrate with a recovery liquid, which is a mixed liquid of hydrofluoric acid with a concentration of 1 mass % to 10 mass % and hydrogen peroxide water with a concentration of 1 mass % to 30 mass %, recovering the recovery liquid, and discharging the recovered recovery liquid to the surface of the silicon substrate, through the nozzle for analysis of a substrate; then conveying the silicon substrate, to which the recovery liquid is discharged, to the drying chamber, installing the silicon substrate in the drying chamber, and drying the silicon substrate by heating; conveying the silicon substrate dried by heating to the analysis stage of the analysis scan port, placing the silicon substrate on the analysis stage, and discharging a strong acid solution or a strong alkali solution to the surface of the silicon substrate through the nozzle for analysis of a substrate; conveying the silicon substrate, to which the strong acid solution or the strong alkali solution is discharged, to the drying chamber, installing the silicon substrate in the drying chamber, and drying the silicon substrate by heating; and conveying the silicon substrate dried by heating to the analysis stage of the analysis scan port, placing the silicon substrate on the analysis stage, and scanning the surface of the silicon substrate with the analysis liquid through the nozzle for analysis of a substrate; and performing inductive coupling plasma analysis on the analysis liquid into which the analysis target is transferred.

First, the method for analyzing a silicon substrate according to the first aspect of the present invention will be described. When a silicon substrate with a thick nitride film formed thereon is analyzed, the silicon substrate drawn from the load port by the substrate conveyance robot is conveyed to the vapor phase decomposition chamber, and installed in the chamber. An etching gas containing vapor of hydrofluoric acid is brought into contact with the silicon substrate to perform vapor phase decomposition treatment. The silicon substrate subjected to vapor phase decomposition treatment is conveyed to the analysis stage of the analysis scan port and placed on the analysis stage by the substrate conveyance robot. Here, the nozzle for analysis of a substrate in the analysis scan port is charged with a recovery liquid which is a mixed liquid of hydrofluoric acid with a concentration of 1 mass % to 10 mass % and hydrogen peroxide water with a concentration of 1 mass % to 30 mass %, and through the nozzle for analysis of a substrate, in which 1 mL of the recovery liquid is held at the nozzle tip, the surface of the silicon substrate is scanned to dissolve $Si(NH_4)_xF_y$ as an ammonium fluoride-based white salt. The recovered recovery liquid contains impurities such as metal, which have been present as residues on the surface of the silicon substrate subjected to vapor phase decomposition treatment.

Subsequently, the recovery liquid recovered in the nozzle for analysis of a substrate is discharged back to the surface of the silicon substrate, and placed at a certain location on the surface of the silicon substrate. The silicon substrate on which the recovery liquid is placed is conveyed to the drying chamber and installed in the drying chamber by the substrate conveyance robot, and dried by heating at about 100° C. to decompose $Si(NH_4)_xF_y$ contained in the recovery liquid, so that a certain amount of Si is removed as a $SiF_4$ gas, but $NH_4F$ and $Si(NH_4)_xF_y$ as white salts are precipitated as residues.

The silicon substrate dried by heating is conveyed to the analysis stage of the analysis scan port, and placed on the analysis stage, and a strong acid solution or a strong alkali solution is discharged through the nozzle for analysis of a substrate. By discharging the strong acid solution or strong alkali solution, $(NH_4)_x$ in $Si(NH_4)_xF_y$ as a white salt in the nitride film is reacted with a strong acid or a strong alkali to change into a compound with good stability, such as $NH_4NO_3$ when reacted with the strong acid, or $NH_3$ when reacted with the strong alkali, so that Si and F in $Si(NH_4)_xF_y$ easily forms $SiF_4$. Thereafter, the silicon substrate, to which the strong acid solution or the strong alkali solution is discharged, is conveyed to the drying chamber and installed in the drying chamber, and dried by heating to evaporate $SiF_4$ as a gas. This step considerably reduces the amount of a Si component on the surface of the silicon substrate.

The silicon substrate dried by heating in the drying chamber is conveyed to the analysis stage and placed on the analysis stage again by the substrate conveyance robot. Here, the nozzle for analysis of a substrate is charged with 1 mL of an analysis liquid, and the surface of the silicon substrate is scanned with the analysis liquid to introduce impurities into the analysis liquid. The analysis liquid recovered through the nozzle for analysis of the substrate is put in an analysis container present in the analysis liquid collection unit, and reaches the nebulizer. Thereafter, the analysis liquid in the nebulizer is analyzed with ICP-MS. This analysis liquid has a low Si concentration (about 10 ppm) even when a 12-inch silicon substrate is analyzed on which a nitride film having a thickness of 200 nm or more is formed. By the method for analyzing a silicon substrate according to the present invention, impurities such as a very small amount of metal in a nitride film formed on a silicon substrate can be analyzed with high accuracy with ICP-MS even when the nitride film has a large thickness of 200 nm or more.

The strong acid solution and the strong alkali solution in the method for analyzing a silicon substrate according to the present invention are not particularly limited. The strong acid is preferably one or more of hydrofluoric acid, sulfuric acid, hydrochloric acid and nitric acid, and the strong alkali is preferably potassium hydroxide or sodium hydroxide. The strong acid or the strong alkali may be used as a solution of one strong acid or strong alkali, or used as a solution of a mixture of a plurality of strong acids or a plurality of strong alkalis. The drying time can be reduced by maintaining the concentration of the strong acid solution or the strong alkali solution as high as possible. Preferably, the recovery liquid and the analysis liquid in the present invention have a hydrofluoric acid concentration of 1 mass % to 10 mass % and a hydrogen peroxide water concentration of 1 mass % to 30 mass %.

By the method for analyzing a silicon substrate according to the present invention, a 12-inch silicon substrate having a nitride film formed on the substrate can be analyzed with high accuracy with ICP-MS by suppressing impacts of the Si concentration even when the nitride film has a large thickness of 200 nm or more, and use of nitric acid as the strong acid may cause a phenomenon in which the surface of the silicon substrate is etched. Thus, for preventing etching of a silicon substrate, the following method for analyzing a silicon substrate was found as a second aspect of the present invention.

The second aspect of the present invention is a method for analyzing a silicon substrate by use of a silicon substrate analysis apparatus including: an analysis scan port having a load port for installing a storage cassette storing a silicon substrate to be analyzed, a substrate conveyance robot capable of drawing, conveying and installing the silicon substrate stored in the load port, an aligner for adjusting a position of the silicon substrate, a drying chamber for drying the silicon substrate by heating, a vapor phase decomposition chamber for etching the silicon substrate with an etching gas, an analysis stage on which the silicon substrate is placed, and a nozzle for analysis of a substrate for scanning with an analysis liquid a surface of the silicon substrate placed on the analysis stage, and recovering the analysis liquid into which an analysis target is transferred; an analysis liquid collection unit having an analysis container to be charged with the analysis liquid recovered through the nozzle for analysis of a substrate; a nebulizer for suctioning the analysis liquid put in the analysis container; and an analyzer for performing inductive coupling plasma analysis on the analysis liquid supplied from the nebulizer, the substrate having a nitride film formed thereon, the method including the steps of: conveying the silicon substrate drawn from the load port by the substrate conveyance robot to the vapor phase decomposition chamber, installing the silicon substrate in the vapor phase decomposition chamber, and subjecting the silicon substrate to vapor phase decomposition treatment with an etching gas in the vapor phase decomposition chamber; conveying the silicon substrate subjected to vapor phase decomposition treatment to the analysis stage of the analysis scan port, placing the silicon substrate on the analysis stage, scanning the surface of the silicon substrate with a recovery liquid, which is a mixed liquid of hydrofluoric acid with a concentration of 1 mass % to 10 mass % and hydrogen peroxide with a concentration of 1 mass % to 30 mass %, recovering the recovery liquid, and discharging the recovered recovery liquid to the surface of the silicon substrate, through the nozzle for analysis of a substrate; then conveying the silicon substrate, to which the recovery liquid is discharged, to the drying chamber, installing the silicon substrate in the drying chamber, and drying the silicon substrate by heating; conveying the silicon substrate dried by heating to the analysis stage of the analysis scan port, placing the silicon substrate on the analysis stage, and discharging a strong acid solution of an acid other than nitric acid or a strong alkali solution to the surface of the silicon substrate through the nozzle for analysis of a substrate; conveying the silicon substrate to which the strong acid solution of an acid other than nitric acid or the strong alkali solution is discharged, to the drying chamber, installing the silicon substrate in the drying chamber, and drying the silicon substrate by heating; subsequently conveying the silicon substrate dried by heating to the analysis stage of the analysis scan port again, placing the silicon substrate on the analysis stage, and discharging a strong acid solution or a strong alkali solution to the surface of the silicon substrate through the nozzle for analysis of a substrate; conveying the silicon substrate, to which the strong acid solution or the strong alkali solution is discharged, to the drying chamber, installing the silicon substrate in the drying chamber, and drying the silicon substrate by heating; and conveying the silicon substrate dried by heating to the analysis stage of the analysis scan port, placing the silicon substrate on the analysis stage, and scanning the surface of the silicon substrate with the analysis liquid through the nozzle for analysis of a substrate; and performing inductive coupling plasma analysis on the analysis liquid into which the analysis target is transferred.

In the second aspect of the present invention, treatment with a strong acid solution or a strong alkali solution is performed twice after the treatment with a recovery liquid in the first aspect of the present invention. First, a strong acid solution of an acid other than nitric acid or a strong alkali solution is discharged to the surface of the silicon substrate treated with the recovery liquid, and the silicon substrate is dried by heating. Subsequently, again, a strong acid solution (which may contain nitric acid as an acid forming the strong acid solution) or a strong alkali solution is discharged, and the silicon substrate is dried by heating. Thereafter, the silicon substrate is scanned with the analysis liquid.

It is considered that when the strong acid solution of nitric acid is discharged to the surface of the silicon substrate after the treatment with the recovery liquid, hydrogen fluoride remaining on the surface of the silicon substrate is mixed with nitric acid, and consequently the following reaction takes place, so that the silicon substrate is etched.

$$6HF+4HNO_3+Si\rightarrow H_2SiF_6+4NO_2+4H_2O$$

Thus, in the second aspect of the present invention, as first treatment with a strong acid solution after the treatment with the recovery liquid, a strong acid solution with an acid other than nitric acid or a strong alkali solution is discharged, and the silicon substrate is dried by heating to remove a certain amount of the Si component from the surface of the silicon substrate. Thereafter, as second treatment, a strong acid solution or a strong alkali solution is discharged to the surface of the silicon substrate again, and the silicon substrate is dried by heating to considerably reduce the amount of the Si component on the surface of the silicon substrate. The method for analyzing a silicon substrate according to the second aspect of the present invention enables considerable reduction of the amount of the Si component on the surface of the silicon substrate while suppressing etching of the surface of the silicon substrate.

In the first treatment in the second aspect of the present invention, one or more of hydrofluoric acid, sulfuric acid and hydrochloric acid can be used as the acid other than nitric acid, which forms the strong acid solution, and potassium hydroxide and/or sodium hydroxide can be used as the strong alkali solution. In the second treatment, one or more of hydrofluoric acid, sulfuric acid, hydrochloric acid and nitric acid can be used as the acid forming the strong acid solution, and potassium hydroxide and/or sodium hydroxide can be used.

The present inventors found the following method for analyzing a silicon substrate (third aspect of the present invention) as an alternative for the second aspect of the present invention. The third aspect of the present invention is a method for analyzing a silicon substrate by use of a silicon substrate analysis apparatus including: an analysis scan port having a load port for installing a storage cassette storing a silicon substrate to be analyzed, a substrate conveyance robot capable of drawing, conveying and installing the silicon substrate stored in the load port, an aligner for adjusting a position of the silicon substrate, a drying chamber for drying the silicon substrate by heating, a vapor phase decomposition chamber for etching the silicon substrate with an etching gas, an analysis stage on which the silicon substrate is placed, and a nozzle for analysis of a substrate for scanning with an analysis liquid a surface of the silicon substrate placed on the analysis stage, and recovering the analysis liquid into which an analysis target is transferred; an analysis liquid collection unit having an analysis container to be charged with the analysis liquid recovered through the nozzle for analysis of a substrate; a nebulizer for suctioning the analysis liquid put in the analysis container; and an analyzer for performing inductive coupling plasma analysis on the analysis liquid supplied from the nebulizer, the substrate having a nitride film formed thereon, the method including the steps of: conveying the silicon substrate drawn from the load port by the substrate conveyance robot to the vapor phase decomposition chamber, installing the silicon substrate in the vapor phase decomposition chamber, and subjecting the silicon substrate to vapor phase decomposition treatment with an etching gas in the vapor phase decomposition chamber; conveying the silicon substrate subjected to vapor phase decomposition treatment to the analysis stage of the analysis scan port, placing the silicon substrate on the analysis stage, and performing first solution treatment including discharging a strong acid solution or a strong alkali solution to the surface of the silicon substrate through the nozzle for analysis of a substrate, conveying the silicon substrate, to which the strong acid solution or the strong alkali solution is discharged, to the drying chamber, installing the silicon substrate in the drying chamber, and drying the silicon substrate by heating; conveying the silicon substrate, which is dried by heating through the first solution treatment, to the analysis stage of the analysis scan port, placing the silicon substrate on the analysis stage, and performing second solution treatment including discharging a strong acid solution or a strong alkali solution different from that in the first solution treatment to the surface of the silicon substrate, conveying the silicon substrate, to which the strong acid solution or the strong alkali solution different from that in the first solution treatment is discharged, to the drying chamber, installing the silicon substrate in the drying chamber, and drying the silicon substrate by heating; and conveying the silicon substrate, which is dried by heating through the second solution treatment, to the analysis stage of the analysis scan port, placing the silicon substrate on the analysis stage, and scanning the surface of the silicon substrate with the analysis liquid through the nozzle for analysis of a substrate; and performing inductive coupling plasma analysis on the analysis liquid into which the analysis target is transferred.

Here, the method for analyzing a silicon substrate according to the third aspect of the present invention will be described. Here, only different points from the method for analyzing a silicon substrate according to the second aspect of the present invention will be explained.

In the method for analyzing a silicon substrate according to the third aspect of the present invention, two-stage solution treatment is performed instead of performing treatment with the recovery liquid of hydrofluoric acid and hydrogen peroxide water after the vapor phase decomposition treatment. That is, in the third aspect of the present invention, first solution treatment is performed in which a strong acid solution or a strong alkali solution is discharged to the surface of the silicon substrate after the vapor phase decomposition treatment, and the silicon substrate, to which the strong acid solution or the strong alkali solution is discharged, is conveyed to the drying chamber, installed in the drying chamber, and dried by heating. Subsequently, second solution treatment is performed in which a strong acid solution or a strong alkali solution different from that in the first solution treatment is discharged to the surface of the silicon substrate subjected to the first solution treatment, and the silicon substrate, to which the strong acid solution or the strong alkali solution different from that in the first treatment is discharged, is conveyed to the drying chamber, installed in the drying chamber, and dried by heating. Thereafter, the surface of the silicon substrate is scanned with an analysis liquid, and inductive coupling plasma analysis is performed on the analysis liquid to which an analysis target is transferred.

The third aspect of the present invention will be described in detail by taking as an example a case where hydrochloric acid is used as the strong acid in the first solution treatment and nitric acid is used as the strong acid in the second solution treatment. When a hydrochloric acid solution is used for the first solution treatment after the vapor phase decomposition treatment, a part of the Si component turns into the form of $Si(NH_4)_xCl_y$, so that a certain amount of the Si component is evaporated through subsequent drying by heating. The Si component removing ability is enhanced as the hydrochloric acid concentration increases. Mixing of fluorine (F) ions with an oxidant causes etching of the silicon substrate. On the other hand, hydrochloric acid is a reductant, and replacement of fluorine (F) ions by chlorine (Cl) enables suppression of etching of the silicon substrate. When a nitric acid solution is used for the subsequent second solution treatment, $(NH_4)_xCl_y$ and $(NH_4)_xF_y$ moieties of a mixed salt of $Si(NH_4)_xF_y$ and $Si(NH_4)_xCl_y$ generated from the aforementioned hydrochloric acid solution are converted into $(NH_4)_xNO_3$ by nitric acid to facilitate generation of $SiF_4$ and $SiCl_4$. Thereafter, the silicon substrate, to which the nitric acid solution is discharged, is conveyed to the drying chamber, and dried by heating to evaporate $SiF_4$ and $SiCl_4$ as a gas. The step with the aforementioned hydrochloric acid solution and the step with the nitric acid solution considerably reduce the amount of a Si component on the surface of the silicon substrate. Further, in the method for analyzing a silicon substrate according to the third aspect of the present invention, etching of the surface of the silicon substrate can be suppressed. Here, the Si removing efficiency is enhanced as the nitric acid concentration increases.

Preferably, the concentration of the strong acid solution or the strong alkali solution in each of the first to third aspects of the present invention is as follows. The concentration shown here is a mass concentration of each chemical which is used singly. The concentration of the strong acid is 18% to 36% for hydrochloric acid, 34% to 68% for nitric acid, 1% to 38% for hydrofluoric acid and 1% to 10% for sulfuric acid, and the concentration of the strong alkali is 1% to 50% for potassium hydroxide and 1% to 30% for sodium hydroxide. When a plurality of acids or alkalis are used in combination, a solution can be prepared with an adjustment made as appropriate.

In the method for analyzing a silicon substrate according to the present invention, the heating temperature in drying by heating is preferably 100° C. to 130° C. When the temperature is higher than 130° C., impurities such as metal tend to be evaporated at the time of evaporation of the Si component. When the temperature is lower than 100° C., it tends to take much time for drying by heating, so that a liquid component on the silicon substrate is not reliably evaporated.

Advantageous Effects of the Invention

As described above, the method for analyzing a silicon substrate according to the present invention enables impurities such as a very small amount of metal in a nitride film formed on a silicon substrate to be analyzed with high accuracy with ICP-MS even when the nitride film has a large thickness of 200 nm or more.

DESCRIPTION OF EMBODIMENTS

Figure 1:
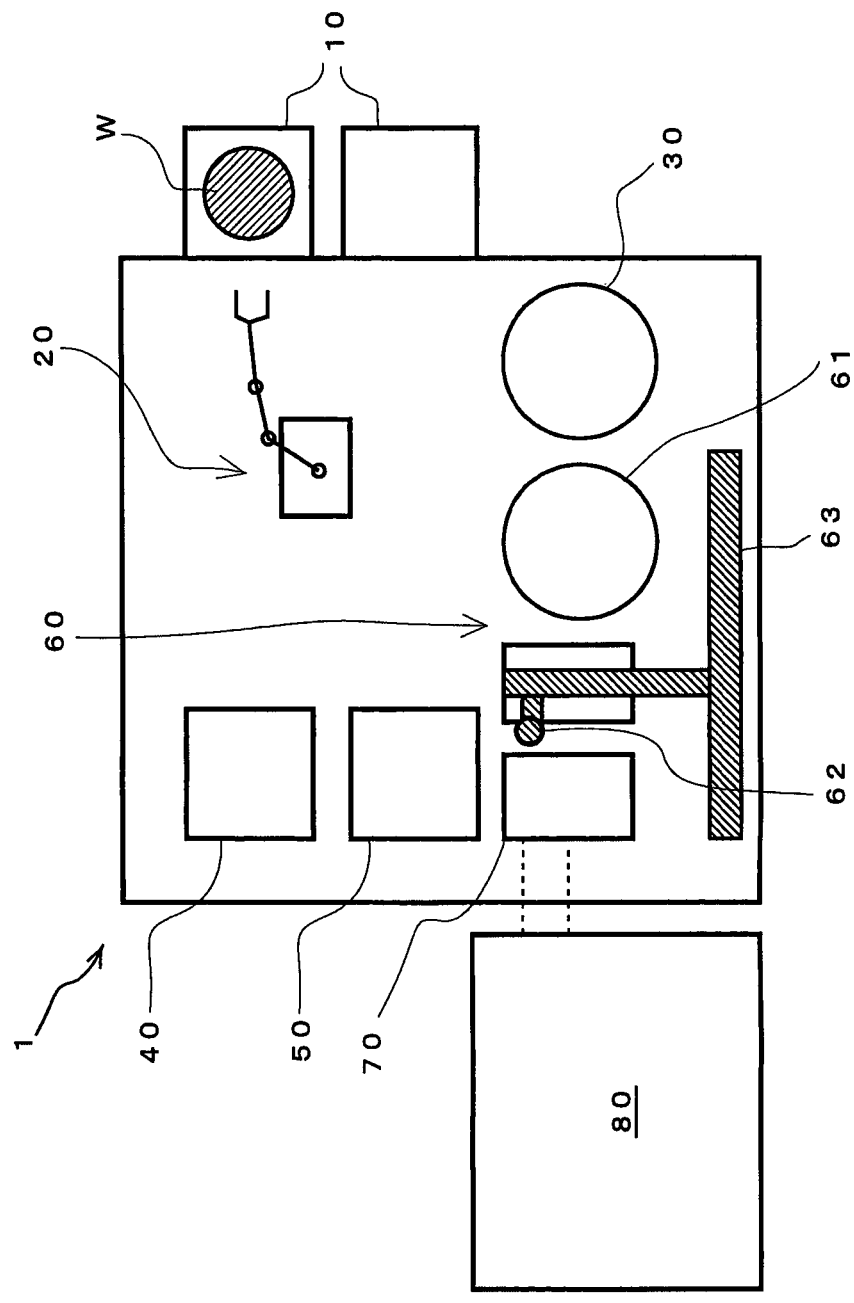
FIG. 1 is a schematic diagram of a silicon substrate analysis apparatus.

Hereinafter, an embodiment of the present invention will be described with reference to the drawings. FIG. 1 is a schematic diagram of a silicon substrate analysis apparatus in an embodiment. The silicon substrate analysis apparatus 1 of FIG. 1 includes a load port 10 to be provided with a storage cassette (not shown) storing a silicon substrate W to be analyzed; a substrate conveyance robot 20 capable of drawing, conveying and installing the silicon substrate W; an aligner 30 for adjusting a position of the silicon substrate W; a vapor phase decomposition chamber 40 for etching the silicon substrate W; a drying chamber 50 for drying treatment by heating; an analysis stage 61 on which the silicon substrate W is placed; a nozzle for analysis of a substrate 62 for scanning with an analysis liquid a surface of the silicon substrate placed on the analysis stage 61; a nozzle operation robot 63 for operating the nozzle for analysis of a substrate 62; an analysis scan port 60, an automatic sampler 70 (analysis liquid collection unit) provided with an analysis container (not shown) to be charged with a high-concentration recovery liquid recovered through the nozzle for analysis of a substrate 62; a nebulizer (not shown); and an inductive coupling plasma analysis device (ICP-MS) 80 for performing inductive coupling plasma analysis. The analysis scan port 62 includes a recovery liquid, a strong acid solution, a strong alkali solution and an analysis liquid which adapt to an analysis method.

Figure 2:
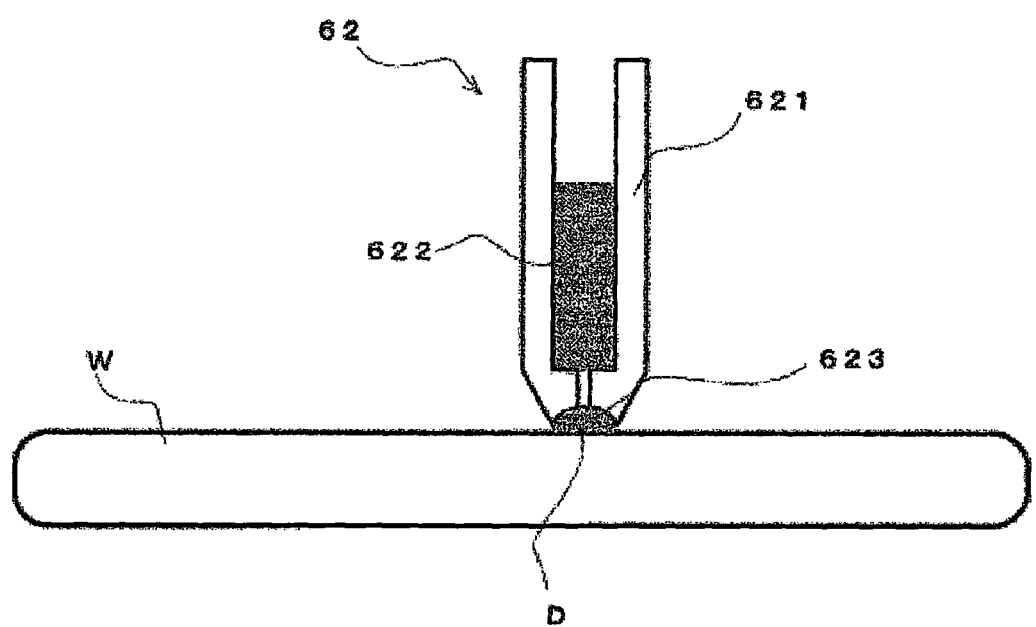
FIG. 2 is a schematic sectional view of a nozzle for analysis of a substrate.

FIG. 2 is a schematic sectional view of the nozzle for analysis of a substrate 62. The nozzle for analysis of a substrate 62, which is operated by a nozzle operation robot (not shown) to perform conveyance, movement and the like of the nozzle for analysis of a substrate 62 allows a solution such as an analysis liquid to be filled and suctioned into a liquid reservoir section 622 of a nozzle main body 621 and the solution to be removed from the liquid reservoir section 622. For example, when the surface of the silicon substrate is scanned with an analysis liquid D, impurities such as a very small amount of metal which are analysis targets are transferred into the analysis liquid by bringing the analysis liquid into contact with a surface of the silicon substrate W with the analysis liquid held in a dome-shaped solution holding section 623 provided at the tip of the nozzle main body 621, and causing the nozzle operation robot to operate so that the analysis liquid D moves along the surface of the silicon substrate.

An analysis procedure with the silicon substrate analysis apparatus according to the embodiment will now be described. Here, the analysis procedure will be described with a method for analyzing a silicon substrate according to the first aspect of the present invention taken as an example. It is possible to adapt to the second and third aspects of the present invention by appropriately operating the silicon substrate analysis apparatus in accordance with the analysis procedure.

First, by having the substrate conveyance robot 20 take out the silicon substrate W to be analyzed from the load port 10, and convey to the aligner 30 installed in the apparatus, where the position of the silicon substrate W is adjusted. Thereafter, the silicon substrate W is conveyed to the vapor phase decomposition chamber 40, and disposed in the chamber.

In the vapor phase decomposition chamber 40, vapor phase decomposition treatment is performed in which an etching gas containing vapor of hydrofluoric acid is sprayed to the silicon substrate W to etch the surface of the silicon substrate. Through the vapor phase decomposition treatment, impurities such as metal in the nitride film on the surface of the silicon substrate, and silicon-containing compounds remain as residues on the silicon substrate.

The silicon substrate W having been subjected to vapor phase decomposition treatment is conveyed to the analysis stage 61, and placed on the analysis stage 61. The nozzle operation robot 63 is actuated to fill the nozzle for analysis of a substrate 62 with the recovery liquid from the analysis scan port 60. The nozzle for analysis of a substrate 62, which is filled with the recovery liquid, moves onto the silicon substrate, discharges a part of the recovery liquid onto the silicon substrate, and scans the surface of the silicon substrate W with the recovery liquid held at the tip of the nozzle main body. Accordingly, impurities such as metal and silicon-containing compounds, which remain as residues on the silicon substrate, are introduced into the recovery liquid. After scanning with the recovery liquid, the entire amount of the recovery liquid recovered in the nozzle for analysis of a substrate 62 is discharged onto the silicon substrate. At this occasion, the recovery liquid may be discharged to one site, or a plurality of sites.

The silicon substrate W carrying the recovery liquid is conveyed to the drying chamber 50, and disposed in the chamber. The silicon substrate W is dried by heating at a temperature of 100° C. to 130° C. As a result of drying by heating in the drying chamber 50, products such as white salts are precipitated on the silicon substrate.

The heated and dried silicon substrate W is conveyed to the analysis stage 61 and placed on the analysis stage by the substrate conveyance robot 20. The nozzle operation robot 63 is actuated to fill the nozzle for analysis of a substrate 62 with a strong acid solution or a strong alkali solution from the analysis scan port 60. The nozzle for analysis of a substrate 62 discharges the strong acid solution or the strong alkali solution onto the silicon substrate. The silicon substrate W, to which the strong acid solution or the strong alkali solution is discharged, is conveyed to the drying chamber 50, and disposed in the chamber. The silicon substrate W is dried by heating at a temperature of 100° C. to 130° C. As a result of drying by heating in the drying chamber 50, silicon (Si) present on the silicon substrate is volatilized and removed as a $SiF_4$ gas.

The heated and dried silicon substrate W is conveyed to the analysis stage 61 and placed on the analysis stage by the substrate conveyance robot 20. The nozzle operation robot 63 is actuated to fill the nozzle for analysis of a substrate 62 with the analysis liquid from the analysis scan port 60. The nozzle for analysis of a substrate, which is filled with the analysis liquid, moves onto the silicon substrate W, discharges a part of the analysis liquid, and scans the surface of the silicon substrate W with the analysis liquid held at the tip of the nozzle main body. Accordingly, impurities such as metal, which remain as residues on the silicon substrate W, are introduced into the analysis liquid. The scanning with the analysis liquid can be performed in line with the site to which the recovery liquid is discharged. For example, when the recovery liquid is discharged to one site, areas near the discharge site can be scanned, and when the recovery liquid is discharged to a plurality of sites, the entire surface of the silicon substrate W can be scanned.

The analysis liquid, into which impurities are introduced by scanning the surface of the silicon substrate W, is put in a PTFE analysis container (not shown) called a vial and provided in the automatic sampler (analysis liquid collection unit) 70. The analysis liquid in the analysis container is suctioned through the nebulizer, and analyzed with ICP-MS.

Example 1

A 12-inch diameter silicon substrate provided with a 200 nm-thick nitride ($Si_xN_y$) film was analyzed. The result of the analysis will be described. As a recovery liquid, a mixed liquid (1000 μL) of hydrofluoric acid with a concentration of 3 mass % and hydrogen peroxide water with a concentration of 4 mass % was used. 68 mass % nitric acid was used as a strong acid solution, and a mixed liquid of hydrofluoric acid with a concentration of 3 mass % and hydrogen peroxide water with a concentration of 4 mass % was used as an analysis liquid. As ICP-MS which is an analysis device, ELAN DRC II manufactured by PerkinElmer was used. Example 1 corresponds to the first aspect of the present invention in the present application.

Comparative Example 1

A 12-inch diameter silicon substrate provided with a 200 nm-thick nitride ($Si_xN_y$) film was analyzed in accordance with the analysis method in Patent Document 3 in advance. The result of the analysis will be described. As a high-concentration recovery liquid, a mixed liquid (1000 μL) of hydrofluoric acid with a concentration of 20 mass % and hydrogen peroxide water with a concentration of 15 mass % was used. As an analysis liquid, a mixed liquid of hydrofluoric acid with a concentration of 3 mass % and hydrogen peroxide with a concentration of 4 mass % was used. The analysis was performed in accordance with Patent Document 3, followed by scanning the entire surface of the silicon substrate with the analysis liquid to introduce impurities such as metal into the analysis liquid, and examining the Si concentration in 1 ml of the recovered analysis liquid. The result showed that the Si concentration was about 1000 ppm.

The analysis was performed under the conditions in Example 1, followed by scanning the entire surface of the silicon substrate with the analysis liquid to introduce impurities such as metal into the analysis liquid, and examining the Si concentration in 1 ml of the recovered analysis liquid. The result showed that the Si concentration was as low as about 10 ppm. Observation of the surface of the silicon substrate after recovery of the analysis liquid showed that a part of the surface was etched.

Example 2

In Example 2, a silicon substrate similar to that in Example 1 was analyzed in accordance with an analysis method corresponding to the second aspect of the present invention. The result of the analysis will be described. As a recovery liquid, a mixed liquid (1000 μL) of hydrofluoric acid with a concentration of 3 mass % and hydrogen peroxide water with a concentration of 4 mass % was used. 36% hydrochloric acid was used as a strong acid solution in the first treatment, and 68% nitric acid was used as a strong acid solution in the second treatment. As an analysis liquid, a mixed liquid of hydrofluoric acid with a concentration of 3 mass % and hydrogen peroxide water with a concentration of 4 mass % was used. The analysis apparatus, the temperature for drying by heating, and the like were the same as in Example 1.

The analysis was performed under the conditions in Example 2, followed by scanning the entire surface of the silicon substrate with the analysis liquid to introduce impurities such as metal into the analysis liquid, and examining the Si concentration in 1 mL of the recovered analysis liquid. The result showed that the Si concentration was as low as about 10 ppm. Observation of the surface of the silicon substrate after recovery of the analysis liquid showed that there was almost no etched part.

Example 3

In Example 3, a silicon substrate similar to that in Example 1 was analyzed in accordance with an analysis method corresponding to the third aspect of the present invention. The result of the analysis will be described.

In Example 3, a hydrochloric acid solution (1000 μL) with a concentration of 36 mass % as a recovery liquid was used as a first solution, and a nitric acid solution (1 mL) with a concentration of 68 mass % was used as a second solution. As an analysis liquid, a mixed liquid of hydrofluoric acid with a concentration of 3 mass % and hydrogen peroxide water with a concentration of 4 mass % was used. The analysis apparatus, the temperature for drying by heating, and the like were the same as in Example 1.

The analysis was performed under the conditions in Example 3, followed by scanning the entire surface of the silicon substrate with the analysis liquid to introduce impurities such as metal into the analysis liquid, and examining the Si concentration in 1 ml of the recovered analysis liquid. The result showed that the Si concentration was as low as about 10 ppm. Observation of the surface of the silicon substrate after recovery of the analysis liquid showed that there was almost no etched part.

REFERENCE SIGNS LIST

1 Silicon substrate analysis apparatus
10 Load port
20 Substrate conveyance robot
30 Aligner
40 Vapor phase decomposition chamber
50 Drying chamber
60 Analysis scan port
70 Automatic sampler
80 Inductive coupling plasma mass spectrometer
D Analysis liquid
W Silicon substrate

The invention claimed is:

1. A method for analyzing a silicon substrate by use of a silicon substrate analysis apparatus comprising: an analysis scan port having a load port for installing a storage cassette storing a silicon substrate to be analyzed, a substrate conveyance robot capable of drawing, conveying and installing the silicon substrate stored in the load port, an aligner for adjusting a position of the silicon substrate, a drying chamber for drying the silicon substrate by heating, a vapor phase decomposition chamber for etching the silicon substrate with an etching gas, an analysis stage on which the silicon substrate is placed, and a nozzle for analysis of a substrate for scanning with an analysis liquid a surface of the silicon substrate placed on the analysis stage, and recovering the analysis liquid into which an analysis target has been transferred; an analysis liquid collection unit having an analysis container to be charged with the analysis liquid recovered through the nozzle for analysis of a substrate; a nebulizer for suctioning the analysis liquid put in the analysis container; and an analyzer for performing inductive coupling plasma analysis on the analysis liquid supplied from the nebulizer, the silicon substrate having a nitride film formed thereon, wherein the method comprising the steps of:

conveying the silicon substrate drawn from the load port by the substrate conveyance robot to the vapor phase decomposition chamber, installing the silicon substrate in the vapor phase decomposition chamber, and subjecting the silicon substrate to vapor phase decomposition treatment with an etching gas in the vapor phase decomposition chamber; conveying the silicon substrate subjected to vapor phase decomposition treatment to the analysis stage of the analysis scan port, placing the silicon substrate on the analysis stage, scanning the surface of the silicon substrate with a recovery liquid, which is a mixed liquid of hydrofluoric acid with a concentration of 1 mass % to 10 mass % and hydrogen peroxide with a concentration of 1 mass % to 30 mass %, recovering the recovery liquid, and discharging the recovered recovery liquid to the surface of the silicon substrate, through the nozzle for analysis of a substrate;

then conveying the silicon substrate, to which the recovery liquid is discharged, to the drying chamber, installing the silicon substrate in the drying chamber, and drying the silicon substrate by heating;

conveying the heated and dried silicon substrate to the analysis stage of the analysis scan port, placing the silicon substrate on the analysis stage, and discharging a strong acid solution or a strong alkali solution to the surface of the silicon substrate through the nozzle for analysis of a substrate;

conveying the silicon substrate, to which the strong acid solution or the strong alkali solution is discharged, to the drying chamber, installing the silicon substrate in the drying chamber, and drying the silicon substrate by heating; and conveying the silicon substrate dried by heating to the analysis stage of the analysis scan port, placing the silicon substrate on the analysis stage, and scanning the surface of the silicon substrate with the analysis liquid through the nozzle for analysis of a substrate; and performing inductive coupling plasma analysis on the analysis liquid into which the analysis target is transferred.

2. The method for analyzing a silicon substrate according to claim 1, wherein the strong acid is one or more of hydrofluoric acid, sulfuric acid, hydrochloric acid and nitric acid, and the strong alkali is potassium hydroxide and/or sodium hydroxide.

3. The method for analyzing a silicon substrate according to claim 2, wherein the heating temperature in the drying by heating is 100° C. to 130° C.

4. The method for analyzing a silicon substrate according to claim 1, wherein the heating temperature in the drying by heating is 100° C. to 130° C.

5. A method for analyzing a silicon substrate by use of a silicon substrate analysis apparatus comprising: an analysis scan port having a load port for installing a storage cassette storing a silicon substrate to be analyzed, a substrate conveyance robot capable of drawing, conveying and installing the silicon substrate stored in the load port, an aligner for adjusting a position of the silicon substrate, a drying chamber for drying the silicon substrate by heating, a vapor phase decomposition chamber for etching the silicon substrate with an etching gas, an analysis stage on which the silicon substrate is placed, and a nozzle for analysis of a substrate for scanning with an analysis liquid a surface of the silicon substrate placed on the analysis stage, and recovering the analysis liquid into which an analysis target is transferred; an analysis liquid collection unit having an analysis container to be charged with the analysis liquid recovered through the nozzle for analysis of a substrate; a nebulizer for suctioning the analysis liquid put in the analysis container; and an analyzer for performing inductive coupling plasma analysis on the analysis liquid supplied from the nebulizer, the silicon substrate having a nitride film formed thereon, wherein the method comprising the steps of:

conveying the silicon substrate drawn from the load port by the substrate conveyance robot to the vapor phase decomposition chamber, installing the silicon substrate in the vapor phase decomposition chamber, and subjecting the silicon substrate to vapor phase decomposition treatment with an etching gas in the vapor phase decomposition chamber;

conveying the silicon substrate having been subjected to vapor phase decomposition treatment to the analysis stage of the analysis scan port, placing the silicon substrate on the analysis stage, scanning the surface of the silicon substrate with a recovery liquid, which is a mixed liquid of hydrofluoric acid with a concentration of 1 mass % to 10 mass % and hydrogen peroxide with a concentration of 1 mass % to 30 mass %, recovering the recovery liquid, and discharging the recovered recovery liquid to the surface of the silicon substrate, through the nozzle for analysis of a substrate;

then conveying the silicon substrate, to which the recovery liquid is discharged, to the drying chamber, installing the silicon substrate in the drying chamber, and heating and drying the silicon substrate;

conveying the heated and dried silicon substrate to the analysis stage of the analysis scan port, placing the silicon substrate on the analysis stage, and discharging either a strong acid solution of an acid other than nitric acid or a strong alkali solution to the surface of the silicon substrate through the nozzle for analysis of a substrate;

conveying the silicon substrate to which the strong acid solution of an acid other than nitric acid or the strong alkali solution is discharged, to the drying chamber, installing the silicon substrate in the drying chamber, and heating and drying the silicon substrate;

subsequently conveying the heated and dried silicon substrate to the analysis stage of the analysis scan port again, placing the silicon substrate on the analysis stage, and discharging a strong acid solution or a strong alkali solution to the surface of the silicon substrate through the nozzle for analysis of a substrate;

conveying the silicon substrate, to which the strong acid solution or the strong alkali solution is discharged, to the drying chamber, installing the silicon substrate in the drying chamber, and heating and drying the silicon substrate; and conveying the heated and dried silicon substrate to the analysis stage of the analysis scan port, placing the silicon substrate on the analysis stage, and scanning the surface of the silicon substrate with the analysis liquid through the nozzle for analysis of a substrate; and performing inductive coupling plasma analysis on the analysis liquid into which the analysis target is transferred.

6. The method for analyzing a silicon substrate according to claim 5, wherein the strong acid is one or more of hydrofluoric acid, sulfuric acid, hydrochloric acid and nitric acid, and the strong alkali is potassium hydroxide and/or sodium hydroxide.

7. The method for analyzing a silicon substrate according to claim 6, wherein the heating temperature in the drying by heating is 100° C. to 130° C.

8. The method for analyzing a silicon substrate according to claim 5, wherein the heating temperature in the drying by heating is 100° C. to 130° C.

9. A method for analyzing a silicon substrate by use of a silicon substrate analysis apparatus comprising: an analysis scan port having a load port for installing a storage cassette storing a silicon substrate to be analyzed, a substrate conveyance robot capable of drawing, conveying and installing the silicon substrate stored in the load port, an aligner for adjusting a position of the silicon substrate, a drying chamber for drying the silicon substrate by heating, a vapor phase decomposition chamber for etching the silicon substrate with an etching gas, an analysis stage on which the silicon substrate is placed, and a nozzle for analysis of a substrate for scanning with an analysis liquid a surface of the silicon substrate placed on the analysis stage, and recovering the analysis liquid into which an analysis target is transferred; an analysis liquid collection unit having an analysis container to be charged with the analysis liquid recovered through the nozzle for analysis of a substrate; a nebulizer for suctioning the analysis liquid put in the analysis container; and an analyzer for performing inductive coupling plasma analysis on the analysis liquid supplied from the nebulizer, the silicon substrate having a nitride film formed thereon, wherein the method comprising the steps of:

conveying the silicon substrate drawn from the load port by the substrate conveyance robot to the vapor phase decomposition chamber, installing the silicon substrate in the vapor phase decomposition chamber, and subjecting the silicon substrate to vapor phase decomposition treatment with an etching gas in the vapor phase decomposition chamber;

conveying the silicon substrate having been subjected to vapor phase decomposition treatment to the analysis stage of the analysis scan port, placing the silicon substrate on the analysis stage, and performing first solution treatment including discharging a strong acid solution or a strong alkali solution to the surface of the silicon substrate through the nozzle for analysis of a substrate, conveying the silicon substrate, to which the strong acid solution or the strong alkali solution has been discharged, to the drying chamber, installing the silicon substrate in the drying chamber, and heating and drying the silicon substrate;

conveying the silicon substrate, which has been heated and dried through the first solution treatment, to the analysis stage of the analysis scan port, placing the silicon substrate on the analysis stage, and performing second solution treatment including discharging a strong acid solution or a strong alkali solution different from that in the first solution treatment to the surface of the silicon substrate;

conveying the silicon substrate, to which the strong acid solution or the strong alkali solution different from that in the first solution treatment is discharged, to the drying chamber, installing the silicon substrate in the drying chamber, and heating and drying the silicon substrate; and conveying the silicon substrate, which has been heated and dried through the second solution treatment, to the analysis stage of the analysis scan port, placing the silicon substrate on the analysis stage, and scanning the surface of the silicon substrate with the analysis liquid through the nozzle for analysis of a substrate; and performing inductive coupling plasma analysis on the analysis liquid into which the analysis target has been transferred.

10. The method for analyzing a silicon substrate according to claim 9, wherein the strong acid is one or more of hydrofluoric acid, sulfuric acid, hydrochloric acid and nitric acid, and the strong alkali is potassium hydroxide and/or sodium hydroxide.

11. The method for analyzing a silicon substrate according to claim 10, wherein the heating temperature in the drying by heating is 100° C. to 130° C.

12. The method for analyzing a silicon substrate according to claim 9, wherein the heating temperature in the drying by heating is 100° C. to 130° C.

* * * * *